United States Patent [19]

Okabe et al.

[11] Patent Number: 5,448,092
[45] Date of Patent: Sep. 5, 1995

[54] INSULATED GATE BIPOLAR TRANSISTOR WITH CURRENT DETECTION FUNCTION

[75] Inventors: Naoto Okabe, Higashiura; Norihito Tokura, Okazaki, both of Japan

[73] Assignee: Nippondenso Co., Ltd., Kariya, Japan

[21] Appl. No.: 70,362

[22] PCT Filed: Sep. 28, 1992

[86] PCT No.: PCT/JP92/01239
§ 371 Date: Jun. 1, 1993
§ 102(e) Date: Jun. 1, 1993

[87] PCT Pub. No.: WO93/07645
PCT Pub. Date: Apr. 15, 1993

[30] Foreign Application Priority Data

Oct. 1, 1991 [JP] Japan .................. 3-253948

[51] Int. Cl.$^6$ .................. H01L 29/76; H01L 29/74; H01L 29/00
[52] U.S. Cl. .................. 257/327; 257/173; 257/379; 257/467; 257/541
[58] Field of Search .................. 257/139, 140, 146, 147, 257/154, 173, 174, 212, 328, 335, 336, 337, 339, 341, 342, 378, 379, 380, 467, 469, 536, 541, 340, 327

[56] References Cited

U.S. PATENT DOCUMENTS

| | | | |
|---|---|---|---|
| 4,783,690 | 11/1988 | Walden et al. | 257/140 |
| 4,962,411 | 10/1990 | Tokura et al. | 257/336 |
| 4,980,740 | 12/1990 | Pattanayak et al. | 257/129 |
| 4,985,743 | 1/1991 | Tokura et al. | 257/140 |
| 4,990,978 | 2/1991 | Kondoh | 257/378 |
| 5,169,793 | 12/1992 | Okabe et al. | 257/328 |

FOREIGN PATENT DOCUMENTS

| | | | |
|---|---|---|---|
| 60-94772 | 5/1985 | Japan | 257/140 |
| 63-12175 | 1/1988 | Japan | 257/336 |
| 63-104480 | 5/1988 | Japan | 257/341 |
| 63-164473 | 7/1988 | Japan | 257/341 |
| 63-213370 | 9/1988 | Japan | 257/336 |
| 2138773 | 5/1990 | Japan | 257/336 |

OTHER PUBLICATIONS

Tokura, U.S. patent Appln. No. 08/56,946; Okabe, U.S. patent Appln. No. 07/849,689 & Tokura, U.S. patent Appln. No. 07/735,512.

*Primary Examiner*—Steven H. Loke
*Attorney, Agent, or Firm*—Cushman, Darby & Cushman

[57] ABSTRACT

An insulated gate bipolar transistor (IGBT) element has a current detection function. An impurity-diffused area is formed at an area different from a unit cell area on the surface of the element. The current detection is performed by detecting a voltage drop due to carriers flowing in the lateral resistance of the impurity-diffused area. For example, in an n-channel IGBT, electrons are injected from a source electrode through an n-type source layer and the channel to an n-type drain layer at the cell when the unit cell is in an on-state. The pn junction at the drain side is forwardly biased to inject holes from the p-type drain layer to the n-type drain layer. At this time, the electrons also flow to the lower side of the p-type impurity-diffused area provided as the detection portion. Thus, the hole injection occurs at this portion. These surplus holes are discharged through the p-type layer of the detection portion to the source electrode. A potential which corresponds to a product of the lateral resistance of the p-type layer and a hole current appears at the source potential. By detecting this potential and converting the detected potential, an element current can be detected.

14 Claims, 11 Drawing Sheets

INSULATED GATE BIPOLAR TRANSISTOR WITH CURRENT DETECTION FUNCTION

TECHNICAL FIELD

This invention relates to an insulated gate bipolar transistor equipped with a current detection function.

BACKGROUND ART

In order to prevent a switching element from being broken down due to an over-current and prevent circuit parts other than the power element from being broken down due to a current above a permissible current value in a system equipped with a power switching element, the system is required to be provided with a function for monitoring a current value flowing into the power switching element and restricting the current.

As means of providing the current detection function as described above in an insulated gate bipolar transistor (IGBT) element has been proposed as disclosed in Japanese Laid-open Patent Application No. 60-94772 or Japanese Laid-Open Patent Application No. 2-138773, for example. However, in the former, a resistor for obtaining a current detection signal is required to be set up at the outside thereof, and thus it has a problem that an assembly cost is increased and the size of an assembly is increased. In addition, there is a problem that a part of an element current is sacrificed because the current is partially diverted. On the other hand, the latter proposes such a construction that no resistor is required to be set up at the outside, however, in this construction a signal detection electrode is provided in the neighborhood of a channel portion of a cell area, so that a p-base area of this construction is required to be longer in lateral direction than a usual length to set up a contact area. Therefore, there is a problem that latch-up current value is depressed due to an increase of holes flowing into the p-base area.

This invention has been implemented in view of the above various problems, and has an object to provide an IGBT equipped with a current detection structure which requires no signal detecting resistor at the outside thereof, and induces no depression of latch-up current value.

DISCLOSURE OF INVENTION

In order to attain the above object, the IGBT according to this invention has been designed on the basis of an idea that an impurity-diffused area is formed at an area different from an unit cell area on the surface of an element, and a voltage drop due to carriers flowing through a lateral resistance of the impurity-diffused area is detected to perform a current detection, and specifically the IGBT comprises a unit cell area including a first semiconductor layer of a first conductivity type formed at a drain electrode side, of a second semiconductive layer of a second conductivity type, which is formed on the first semiconductor layer of the first conductivity type and whose conductivity is modulated by injection of carriers, a third semiconductor layer of the first conductivity type which is selectively formed on the surface of the second semiconductor layer, a fourth semiconductor layer of the second conductivity which is selectively formed on the surface of the third semiconductor layer, a gate electrode which is formed at least on a gate insulated film on the surface of the third semiconductor layer between the second semiconductor layer and the fourth semiconductor layer, and a source electrode which is formed on the surface of the third semiconductor layer and the surface of the fourth semiconductor layer, and a current signal detection area provided in the vicinity of the unit cell area and including a fifth semiconductor layer of the first conductivity type which is formed on the surface of the second semiconductor layer independently of the third semiconductor layer, and two contact areas which are away from each other at a predetermined interval in the fifth semiconductor layer, wherein the fifth semiconductor layer is contacted with the source electrode through one of the two contact areas, and contacted with a signal detection electrode formed independently of the source electrode or the gate electrode through the other contact area.

According to the construction as described above, when the surface of the third semiconductor layer between the second semiconductor layer and the fourth semiconductor layer is inverted by a voltage applied to the gate electrode, majority carriers flow from the source electrode through the fourth semiconductor layer into the second semiconductor layer. Through the stream of the majority carriers, the junction between the first semiconductor layer and the second semiconductor layer is forwardly biased to inject the minority carriers from the drain electrode into the second semiconductor layer, so that the second semiconductor layer is subjected to the conductivity modulation, and the IGBT element carries out its bipolar operation in the unit cell area.

The majority carriers flowing from the source electrode also flow into the second semiconductor layer beneath the fifth semiconductor layer which is formed in the neighborhood of the unit cell area, whereby the junction as described is forwardly biased. Through this operation, the minority carriers also flow from the drain electrode into the second semiconductor layer beneath the fifth semiconductor layer. These minority carriers laterally pass through the inside of the fifth semiconductor layer and flow out through one of the contact areas to the source electrode. At this time, the voltage drop to the source electrode due to the carriers flowing in the fifth semiconductor layer appears as a voltage signal at the signal detection electrode which is contacted with the other contact area. This voltage signal is varied in accordance with the current flowing into the IGBT element, and the current detection can be performed by detecting this voltage signal.

As described above, according to the IGBT of this invention, the lateral resistance of the impurity-diffused area which is formed at an area different from the unit cell forming area on the element is used, and a voltage drop due to carriers flowing in the resistance is detected to perform the current detection, so that a detection resistor is not required to be provided at the outside to divert the current for the current detection. In addition, there is an excellent effect that the latch-up current value which is caused by the structure of the detection portion is not depressed.

BEST MODE FOR CARRYING OUT THE INVENTION

This invention will be hereunder described with reference to embodiments as shown in figures. The embodiments will be representatively described for an n-channel IGBT in which a p type is used as a first conductive type and an n type is used as a second conductive type.

Figure 1:
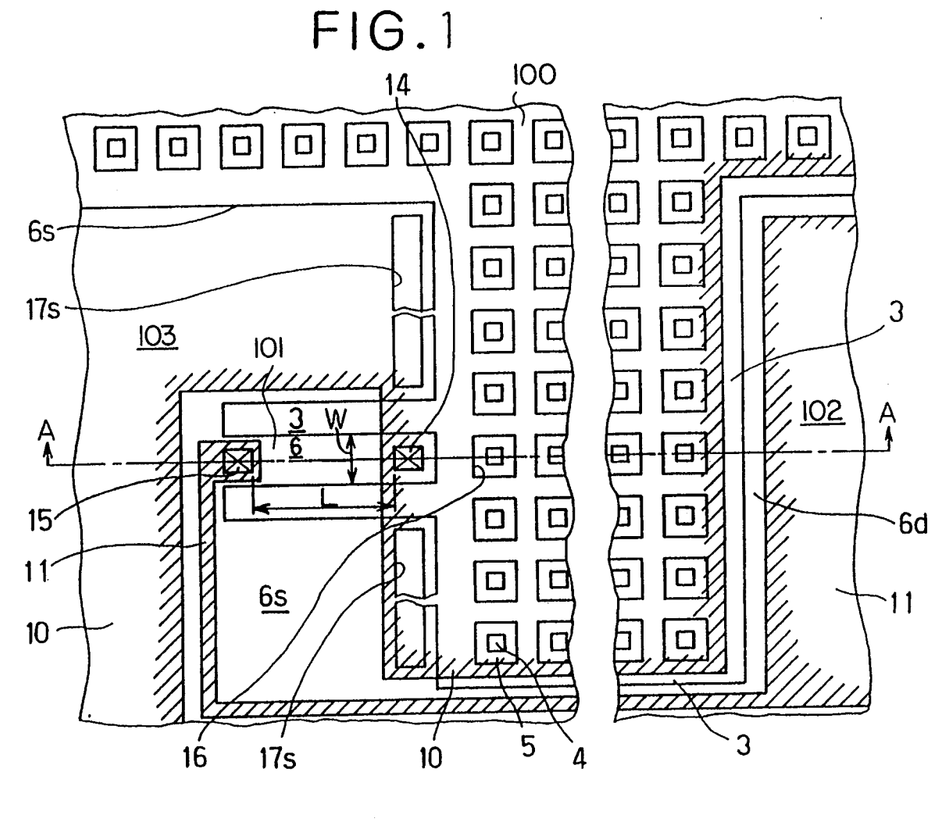
FIG. 1 is a plane view showing a main construction of a first embodiment according to the invention.
Figure 2:
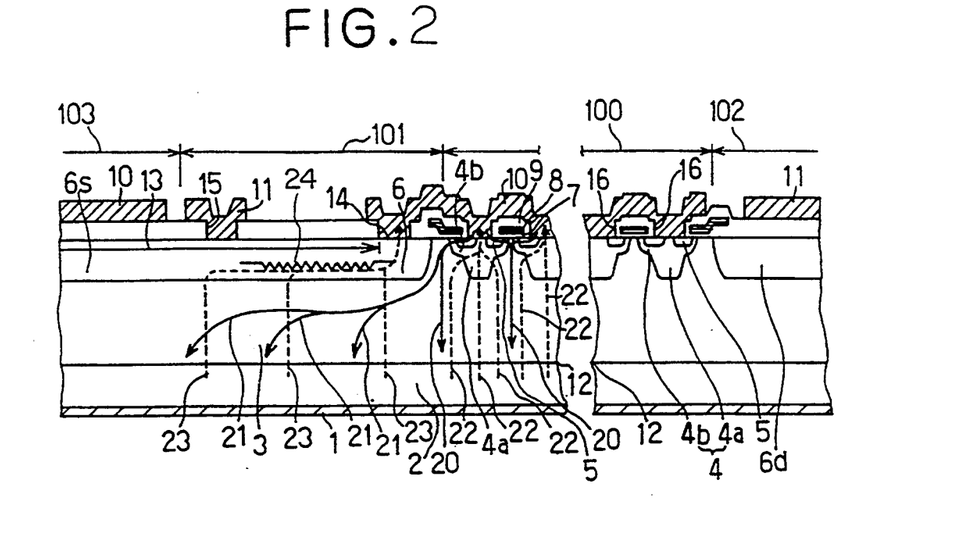
FIG. 2 is a cross-sectional view of FIG. 1 which is taken along A—A.

FIGS. 1 and 2 show the main construction of an IGBT to which the first embodiment of this invention is applied. In this embodiment, a current signal detection portion of the IGBT element (hereinafter referred to as "detection portion") 101 is disposed in the neighborhood of a source electrode pad (hereinafter referred to as "source pad") portion 103, wherein FIG. 1 is a plane view showing a schematic surface pattern of the detection portion 101, a cell area 100, a current signal detection electrode pad (hereinafter referred to as "detection pad") portion 102 and the source pad portion 103, and FIG. 2 is a cross-sectional view of FIG. 1 which is taken along A—A. The construction of this embodiment will be hereunder described in accordance with its manufacturing process.

First, a P+-layer 2 (first semiconductor layer) serving as a semiconductor substrate is prepared, and a high-resistant n-layer 3 (second semiconductor layer) is formed on the layer 2 by an epitaxial growth method or the like. The impurity density and thickness of the n-layer 3 are set to such predetermined values that the IGBT element obtains a predetermined withstanding voltage.

Next, a deep p-layer 4a and a detecting p-layer 6 (fifth semiconductor layer) are simultaneously formed in the cell area 100 and the detection portion 101 in 3 to 6 μm diffusion depth by a selective diffusion method. Here, the p-layer 6 is a diffusion area serving to form a resistor 24 for detecting a current signal, and the resistance value $R_{PL}$ thereof is determined in accordance with the shape (width W, length L in FIG. 1) of the p-layer. As shown in FIGS. 1 and 2, the detecting p-layer 6 is continuously formed with a shielding p-layer 6s in accordance with its diffusion pattern simultaneously with formation of the shielding p-layer 6s at the lower portion of the source pad portion 103, and it is so designed in such a pattern shape as to be continuous with the shielding p-layer 6s at the one end thereof and project from the shielding p-layer 6s. Further, a shielding p-layer 6d may be formed at the lower portion of the detection pad 102 as shown in FIGS. 1 and 2, simultaneously with the deep p-layer 4a, the detecting p-layer 6 and the shielding p-layer 6s.

Further, an n+-source layer 5 (fourth semiconductor layer) is formed inside of the p-layer 4 by the selective diffusion method. In the above manufacturing process, the surface of the n-layer (drain) of the cell area 100 is oxidized to form a gate oxide film 7, and a gate electrode 8 of poly Si which is formed on the gate oxide film 7 and patterned is used as a mask to form a shallow p-layer 4b and the above n+-source layer 5 in self alignment by a so-called DSA (Diffusion Self Alignment), whereby a channel is formed on the surface of the p-layer 4b between the n-layer 3 and the n+-layer 5. A p-base layer 4 (third semiconductor layer) is constructed by the p-layers 4a and 4b.

Thereafter, an insulation film 9 such as a PSG, a BPSG or the like is formed. Subsequently, a contact hole 16 for forming an ohmic contact between the p-base layer 4 and the n+-source layer 5 in the cell area 100, contact holes 14 and 15 for forming an ohmic contact at both ends of the detecting p-layer in the detection portion 101, a contact hole 17s for forming an ohmic contact with the shielding p-layer 6s in the neighborhood of the source pad 103 are respectively formed by removing selectively the gate oxide film 7 and the layer insulation film 9, and then aluminum film is deposited in a layer having a several μm thickness. Subsequently, the aluminum film is patterned by a selective etching treatment to form a source electrode 10, a gate electrode pad (not shown) and a current signal detection electrode 11. Thereafter, a metal film is deposited on the back surface of the p+-layer 2 to form a drain electrode 1, whereby the IGBT element as shown in FIGS. 1 and 2 is formed.

Here, in a case where the source electrode 10 is set to a ground potential, a positive voltage exceeding a threshold voltage is applied to the gate electrode 8, a positive voltage exceeding a forward-biasing voltage (above about 0.7 V) to the pn junction 12 is applied to the drain electrode 1 and the outside of the detection pad (current signal detection electrode) 11 is set to high impedance, electrons flow from the source electrode 10 on the surface through the n+-source layer 5 and the channel to the pn junction 12 (as indicated by an arrow 20), and this flow of the electrons set the pn junction 12 to be a forward biased state, so that the holes are injected from the substrate P+-layer 2 into the n-layer. At this time, the electrons flow into not only the lower portion of the cell area 100, but also the lower portion of the p-layer 6 of the detection portion 101 formed adjacently to the cell area (as indicated by an arrow 21). As a result, the substrate pn junction at the lower portion of the p-layer 6 is also forwardly biased, and thus the hole injection also occurs in the detection portion 101.

The holes injected through the pn junction 12 into the n-layer 3 flow through the inside of the n--layer 3 toward the surface thereof, and flow into the p-base layer 4 and the p-layers 6, 6s on the surface of the element. The holes flowing into the p-base layer 4 flow out into the source electrode 10 contacting with the p-base layer 4 (as indicated by an arrow 22). Further, the holes flowing into the shielding p-layer 6s are discharged through the contact hole 17s to the source electrode 10. On the other hand, the holes flowing into the detecting p-layer 6 can not flow out to the outside of the element in the area 13 because the p-layer 6 is not contacted with the source electrode 10 in the area 13 and the outside of the current signal detection electrode 11 contacted through the contact hole 15 is set to high impedance through the pad. Therefore, the holes flow in a lateral direction in the p-layer 6 and flow out from the contact portion 14 with the source electrode 10 provided at the end of the p-layer 6 to the outside of the element (as indicated by an arrow 23). At this time, a voltage drop $V_S$ occurs due to a hole current $I_{HS}$ flowing in the lateral direction in the p-layer 6 and a lateral resistance 24 of the detecting p-layer 6 (resistance value of $R_{PL}$), and a positive voltage Vs appears at the current signal detection electrode (and the detection pad) 11 with respect to the source electrode 10 which is fixedly set to the ground potential.

By detecting and converting this voltage $V_S$, a total current $I_T$ flowing into the element can be known. The detection principle thereof will be hereunder described. Here, the relationship between $V_S$, $R_{PL}$ and $I_{HS}$ can be represented by the following equation (1).

$$V_S = R_{PL} \times I_{HS} \quad (1)$$

Further, the total current value $I_T$ flowing into the element is the sum of the hole current $I_H$ and the electron current $I_E$ flowing into the source electrode 10 formed on the surface of the element, and it is represented by the following equation.

$$I_T = I_H + I_E \quad (2)$$

Here, $I_H$ and $I_E$ are represented using an common-emitter current amplification factor $h_{FE}$ of an pnp transistor built in the element by the following equation.

$$I_E = I_H / h_{FE} \quad (3)$$

Further, the hole current value $I_{HS}$ flowing in the lateral direction in the p-layer 6 of the detection portion 101 is in proportional relation with the total hole current value $I_H$ flowing in the element, and thus it is represented using a proportional constant K by the following equation.

$$H_H = K \times I_{HS} \quad (4)$$

Here, substituting the equation (3) for the equation (2), $$I_T = (I_H / h_{FE}) + I_H \quad (5)$$

and further substituting the equation (4), the following equation is obtained.

$$I_T = K \cdot I_{HS} \cdot (1 + 1/h_{FE}) \quad (6)$$

Further, substituting the equation (1) for the equation (6), the following equation is obtained.

$$I_T = (K/R_{PL}) \cdot (1 + 1/h_{FE}) \cdot V_S \quad (7)$$

Since K, $R_{PL}$ and $h_{FE}$ are constants, the total current $I_T$ flowing into the element can be obtained by detecting $V_S$.

The voltage drop Vs to be detected can be adjusted by controlling the resistance value $R_{PL}$ through selection of the sheet resistance of the detecting p-layer 6, the width W and length L of the surface pattern, and design of the surface pattern on the basis of the equation (1). Therefore, for example, by increasing $R_{PL}$, high sensitivity can be obtained.

In addition, the current signal detection can be performed using the lateral resistance of the impurity-diffused area which is formed in the neighborhood of the electrode pad on the surface of the element, and thus no detecting resistor is specially required at the outside. Further, since no current flowing in the cell area 100 is not diverted and the current signal detection is carried out using surplus holes injected in the neighborhood of the pad area, the current detection function can be built in the element with sacrifice of the current due to the diversion of the current flowing in the element.

Further, since no cell structure is utilized and only a part of the surface pattern of the pad area is altered, no depression of latch-up current value coming from the structure of the current detecting portion occurs. Still further, the holes injected to the lower portion of the detection portion 101 are rapidly discharged to the source electrode 10 by the detecting p-layer 6, so that no latch-up occurs at the unit cell of the cell area 100 in the neighborhood of the detection portion 101, and the turn-off time can be shortened.

In the above construction, the current detection function can be built in the IGBT element with only the alteration of the pattern relating to the formation of the detecting p-layer 6, and thus the number of photo-processes is not increased with this construction.

As described above, the IGBT of this embodiment is so designed that the current detection is performed by using the lateral resistance of the impurity-diffused area formed at an area different from the unit-cell forming area on the surface of the element and detecting the voltage drop due to the carriers flowing in the lateral resistance. Therefore, the IGBT of this embodiment has an excellent in that it is unnecessary to set up the detecting resistor at the outside to divert the current and detect the diverted current, and no depression of latch-up current value coming from the structure of the detection portion occurs.

Figure 3:
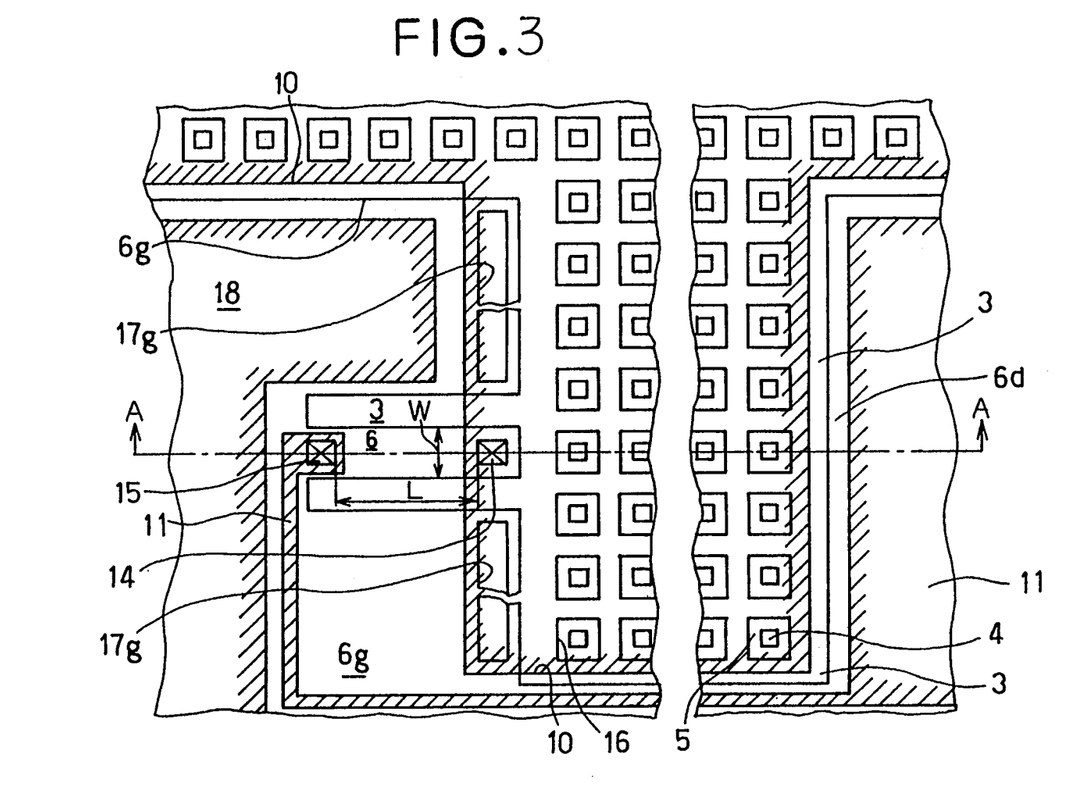
FIG. 3 is a plane view showing a main construction of a second embodiment according to this invention.
Figure 4:
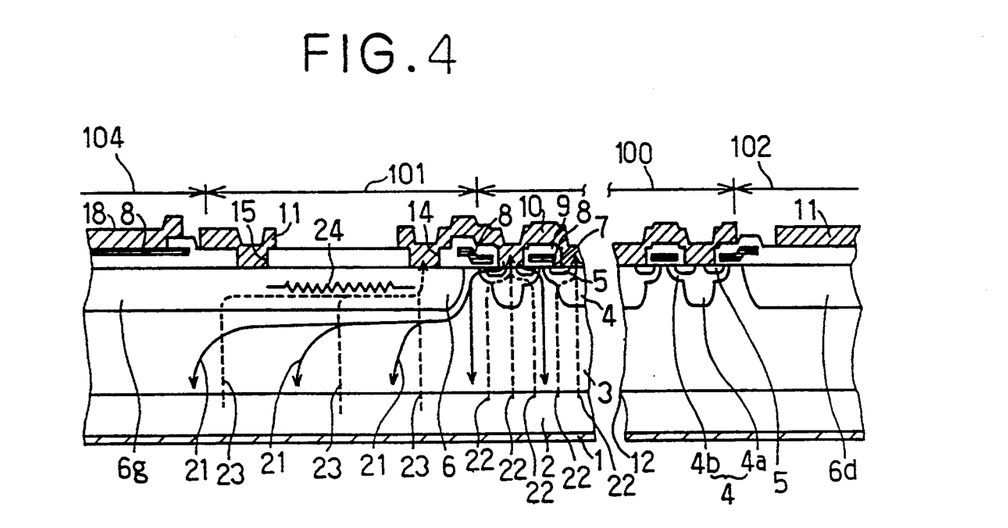
FIG. 4 is a cross-sectional view of FIG. 3 which is taken along A—A.

The first embodiment relates to a case where the detection portion 101 is provided in the neighborhood of the source pad 103, however, it may be provided in the neighborhood of the gate electrode pad portion 104. A second embodiment in which this invention is implemented using a part of the structure of the gate electrode pad portion 104 will be described with reference to FIGS. 3 and 4. FIG. 3 is a plan view schematically showing a surface pattern of a detection portion 101, a cell area 100, a detecting pad portion 102 and a gate pad portion 104, and FIG. 4 is a cross-sectional view of FIG. 3 which is taken along A—A. In these figures, the same elements and operations as FIGS. 1 and 2 are represented by the same reference numerals.

In a manufacturing method of the first embodiment as described above, in a process of forming the deep p-layer 4a of the cell area 100, the shielding p-layer below the source pad and the shielding p-layer 6d below the detection pad, the shape of the shielding p-layer 6g to be formed below the gate pad 18 is partially subjected to a pattern alteration treatment, and the detecting p-layer 6 is formed in accordance with the setting of the detection portion 101. As shown in FIG. 3, the detecting p-layer 6 is so designed to extend from the shielding p-layer 6g, and like the first embodiment it is contacted with the current signal detection electrode 11 through the contact hole 15 at the extending base portion from the shielding p-layer 6g, and also contacted with the source electrode 10 through the contact hole 14 at the other end. In the figures, a reference numeral 17g represents a contact hole through which the shielding p-layer 6g and the source electrode 10 contact each other, and it forms a flow passageway along which the surplus holes injected below the gate electrode pad portion 104 are discharged through the shielding p-layer 6g to the source electrode 10.

In the structure of the second embodiment, the electrons flowing through the channel flow into not only the lower portion of the cell area 100, but also the lower portion of the detection portion 101 formed adjacently to the cell area 100 and the gate pad portion 104 (as indicated by an arrow 21). As a result, the substrate pn junction at the lower portions of the p-layers 6 and 6g is also forwardly biased, and thus holes are injected thereto.

The holes flow through the inside of the n⁻-layer 3 toward the surface thereof, and flow out to the detecting p-layer 6 or shielding p-layer 6g on the surface of the element. These holes laterally flow in the p-type layer, and flow out to the source electrode 10 through the contact holes 14 and 17g, respectively.

Here, in the detecting p-layer 6, a voltage drop Vs occurs due to a lateral hole current $I_{HS}$ of the flow-in holes and the lateral resistance 24 (resistance $R_{PL}$) of the p-layer 6 occurs, so that a positive voltage Vs appears at the current signal detection electrode 11 with respect to the source electrode 10 which is fixed to the ground potential. As the current value flowing in the IGBT element is increased, $I_{HS}$ is also increased in accordance with the increase of the current value, and Vs is also increased. Therefore, by detecting Vs, the total current $I_T$ flowing in the element can be known on the basis of the principle as shown by the equation (7) as described above.

Figure 5:
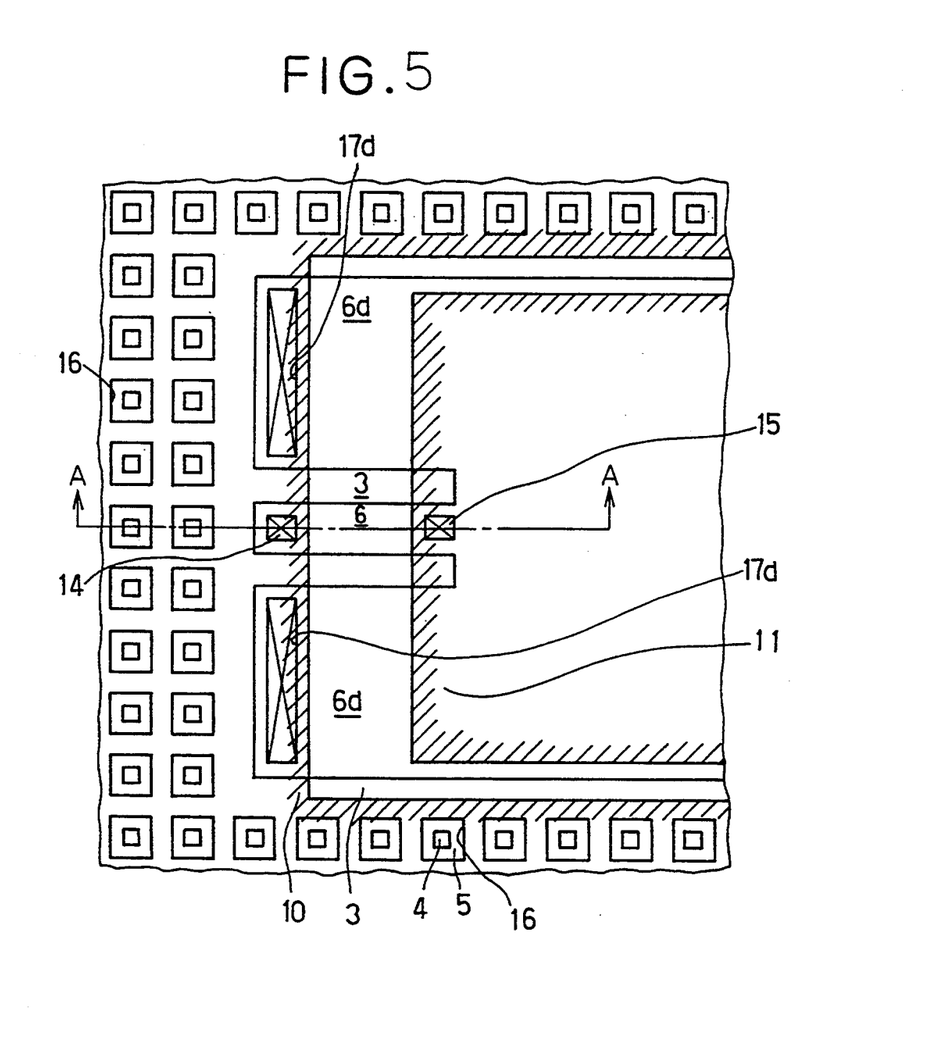
FIG. 5 is a plane view showing a main construction of a third embodiment of this invention.
Figure 6:
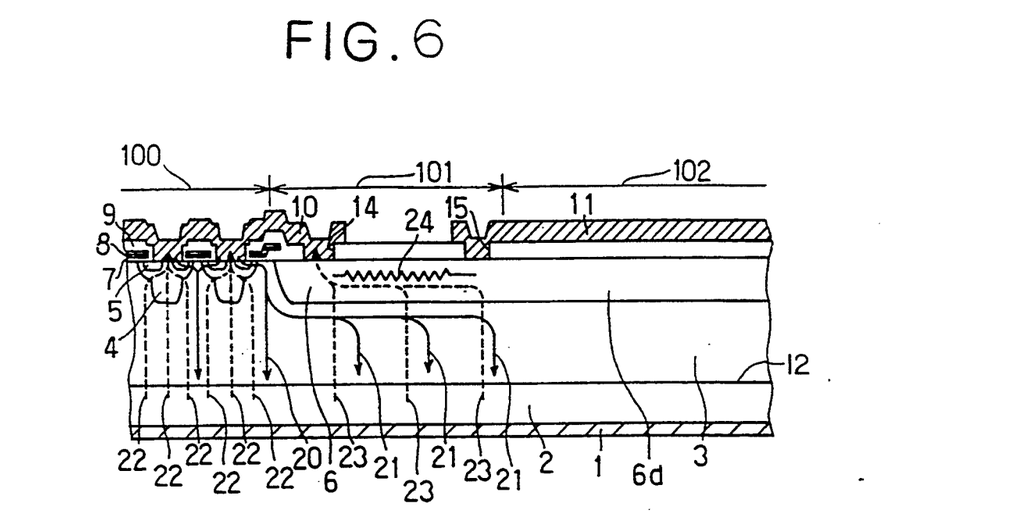
FIG. 6 is a cross-sectional view of FIG. 5 which is taken along A—A.

This invention can be also implemented using the structure of the detection pad portion 102. This case will be described as a third embodiment with reference to FIGS. 5 and 6. FIGS. 5 and 6 are a plan view of the structure of the detection pad 102 and its surrounding, and a cross-sectional view of A—A thereof, respectively. The corresponding elements to those FIGS. 1 to 4 are represented by the same reference numerals.

In the manufacturing method as described above, in the process of forming the deep p-layer 4a and the shielding p-layers 6g and 6d below the respective pads, the shielding p-layer 6d of the detection pad portion 102 and the detecting p-layer 6 of the detection portion 101 are simultaneously formed to have a continuous shape by altering the plane pattern of the detection pad portion 102 in accordance with the formation of the detection portion 101. Through this process, as shown in FIGS. 5 and 6, the detecting p-layer 6 is designed to extend from the shielding p-layer 6d, and contacted with the source electrode 10 and the current signal detection electrode 11 through the contact holes 14 and 15, respectively. In the figures, a reference numeral 17d represents a contact hole through which the shielding p-layer 6d and the source electrode 10 are contacted with each other, and forms a passageway along which the surplus holes injected below the detection pad area 102 are discharged through the shielding p-layer 6d to the source electrode 10.

In this embodiment, the electrons flowing through the channel from the source electrode 10 also flow into not only the lower portion of the cell area 100, but also the lower portions of the detection portion 101 formed adjacently to the cell area 100 and the detecting pad portion 102 (as indicated by an arrow 21). As a result, the pn junction 12 at the lower portion of the p-layers 6, 6d is also forwardly biased and thus the holes are injected thereto.

These holes flow through the inside of the n⁻-layer toward the surface thereof, and flow into the detecting p-layer 6 or the shielding p-layer 6d on the surface of the element. These holes laterally flow in each p-type layer, and flow out to the source electrode 10 through the contact holes 14 and 17d, respectively. Here, in the detecting p-layer 6, a voltage drop Vs occurs due to the lateral hole current $I_{HS}$ of the flow-in holes and the lateral resistance 24 (resistance value $R_{PL}$) of the p-layer 6, and a positive voltage Vs appears at the current signal detection electrode 11 with respect to the source electrode 10 which is fixed to the ground potential. As the current flowing in the IGBT element is increased, $I_{HS}$ increases in accordance with the increase of the current, and Vs also increases. Accordingly, by detecting Vs, the total current $I_T$ flowing in the element can be known on the basis of the principle as shown by the equation (7) as described above.

In the various embodiments as described above, the holes flowing into the detecting p-layer 6 flow along the surface of the p-layer 6, and the intensity of the detection voltage Vs is adjusted by suitably selecting the sheet resistance of the p-layer 6 and the width W and length L of the surface pattern. The lateral resistance value $R_{PL}$ of the p-layer 6 can be easily increased at the same area (in the same pattern shape) by adopting fourth to sixth embodiments as described below to thereby improve the detection sensitivity.

Figure 7:
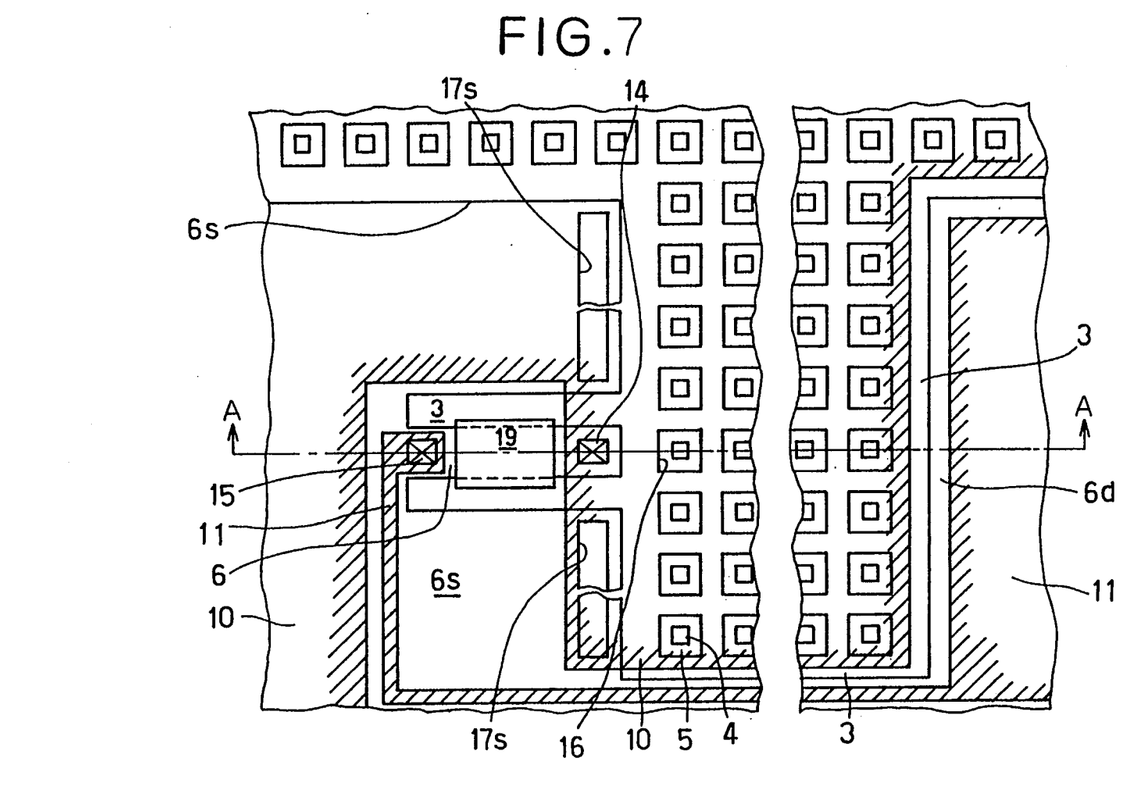
FIG. 7 is a plane view showing a main construction of a fourth embodiment according to this invention.
Figure 8:
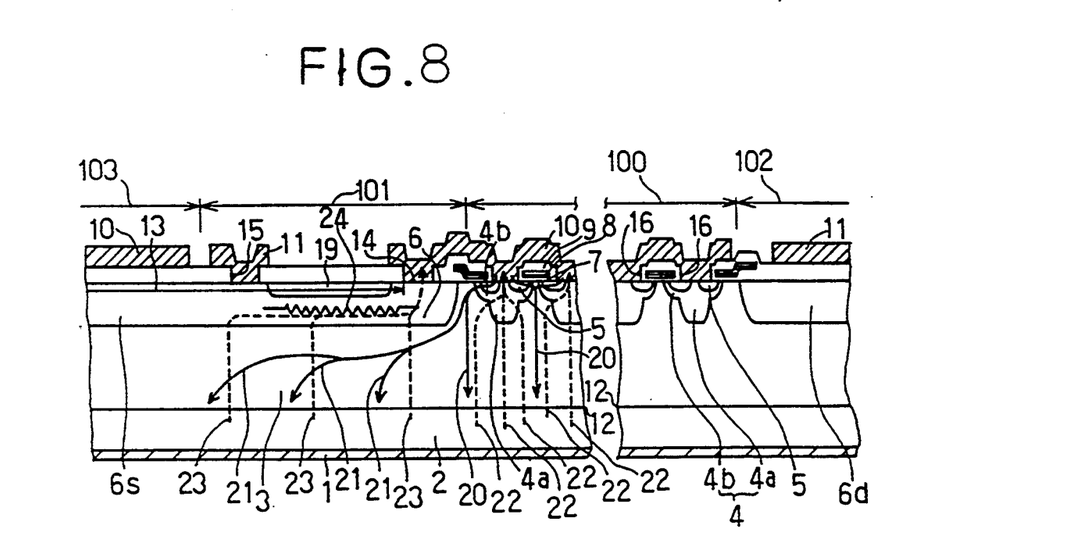
FIG. 8 is a cross-sectional view of FIG. 7 which is taken along A—A.

The fourth embodiment of this invention is shown in FIGS. 7 and 8. This embodiment corresponds to the first embodiment as shown in FIGS. 1 and 2 in which an n-type layer 19 (sixth semiconductor layer) is formed on the surface of the detecting p-layer 6 of the detection portion 101. This n-type layer 19 may be formed simultaneously with the formation of the n⁺-source layer 5.

In this structure, the sheet resistance of the detecting p-layer 6 of the detection portion 101 is larger than that of the first embodiment (pinch resistance) due to the formation of the n-type layer 19, and thus the lateral resistance 24 can be set to a larger value to improve the detection sensitivity. Since the n-type layer 19 is not contacted with the metal electrode, no latch-up phenomenon occurs.

Figure 9:
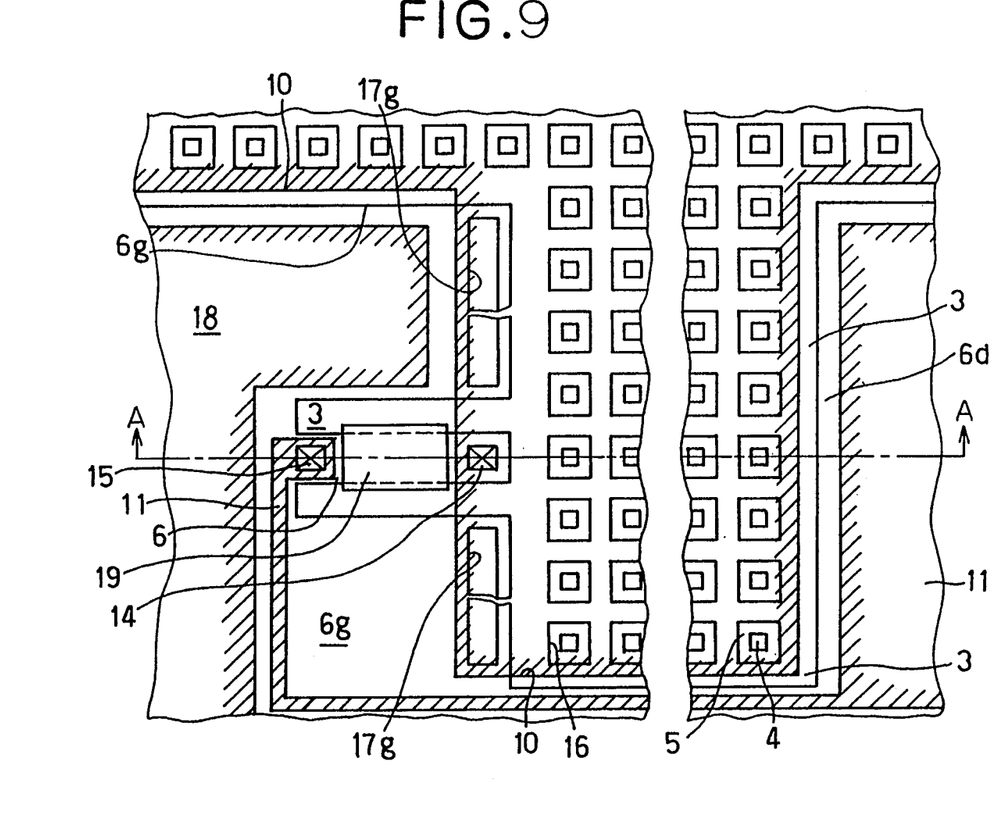
FIG. 9 is a plane view showing a main construction of a fifth embodiment according to this invention.
Figure 10:
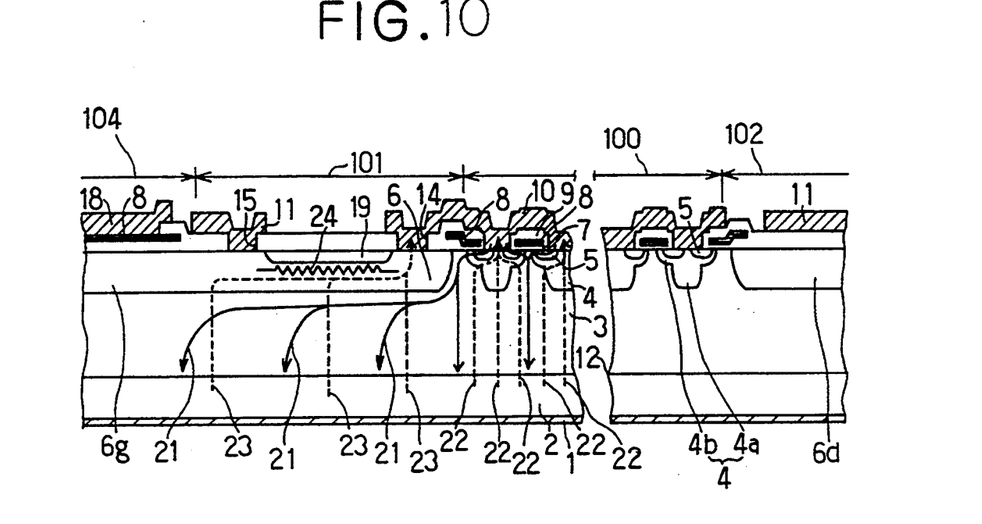
FIG. 10 is a cross-sectional view of FIG. 9 which is taken along A—A.
Figure 11:
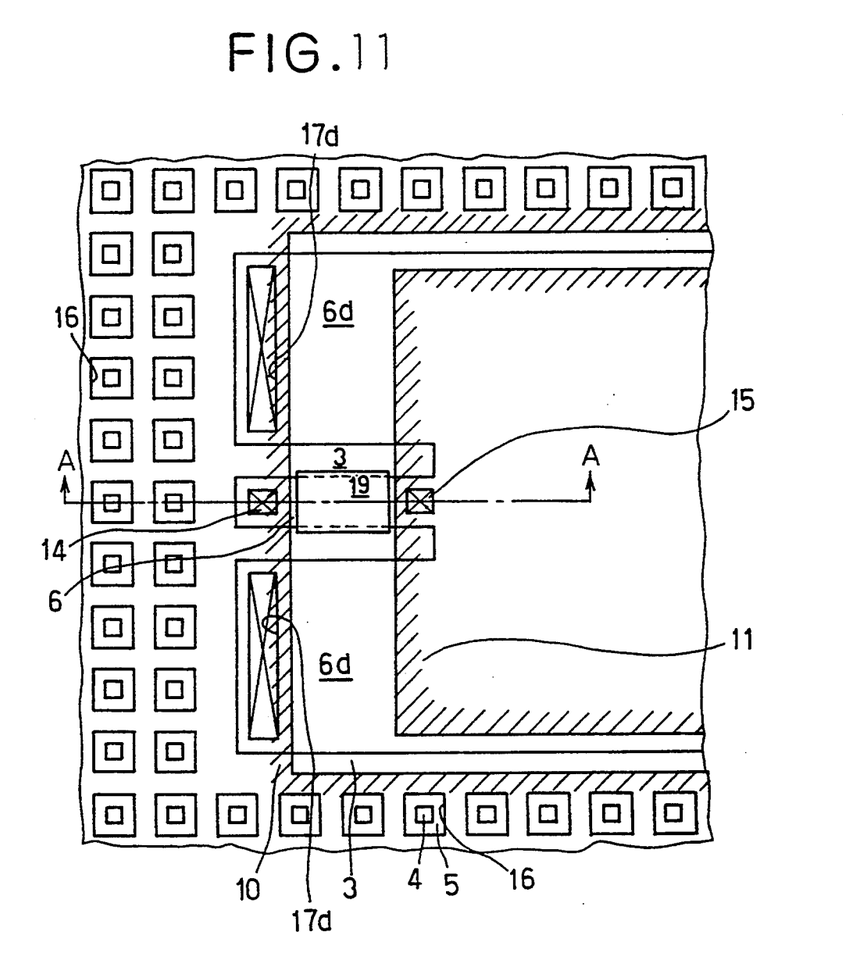
FIG. 11 is a plane view showing a main construction of a sixth embodiment of this invention.
Figure 12:
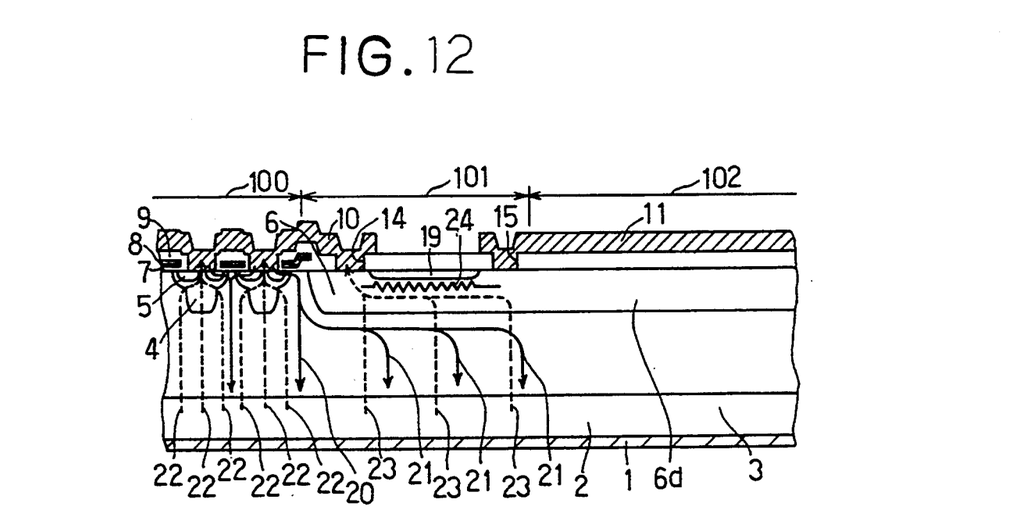
FIG. 12 is a cross-sectional view of FIG. 11 which is taken along A—A.

Similarly, the fifth embodiment as shown in FIGS. 9 and 10 corresponds to the second embodiment as shown in FIGS. 3 and 4 in which an n-type layer 19 is formed on the surface of the detecting p-layer 6 of the detection portion 101, and the sixth embodiment as shown in FIGS. 11 and 12 corresponds to the third embodiment as shown in FIGS. 5 and 6 in which an n-type layer 19 is formed on the surface of the detecting p-layer 6 of the detection portion 101. In both of the embodiments, the signal detection sensitivity can be improved by the pinch resistance like the fourth embodiment as shown in FIGS. 7 and 8.

Next, a temperature compensation structure for compensating the temperature-dependence of the detection signal Vs in the above various embodiments will be described.

Figure 13:
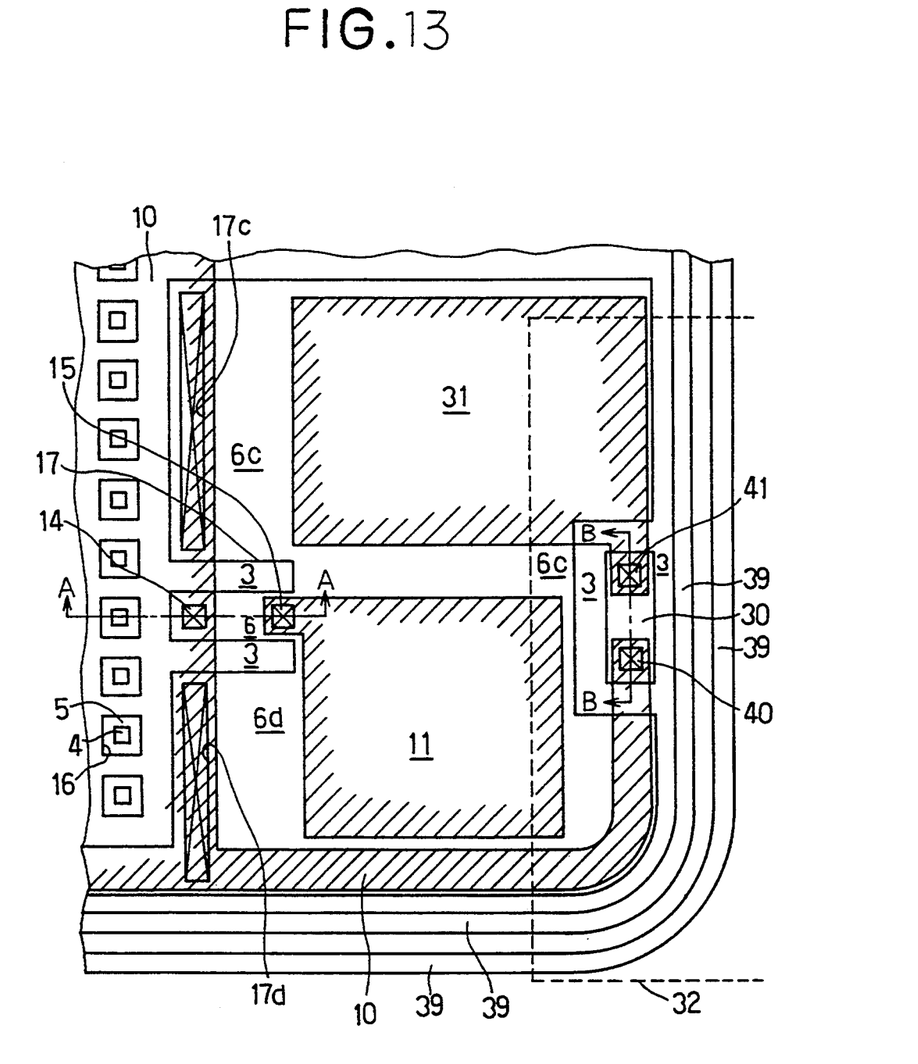
FIG. 13 is a plane view showing a main construction of a seventh embodiment according to this invention.

A case where the temperature compensation structure is added to the third embodiment will be described with reference to FIGS. 13 and 14. FIG. 13 is a plan view showing the detection portion and the plane pattern of the temperature compensating resistance portion, and FIG. 14 shows the principle of the temperature compensation of the detection voltage Vs using the cross-sectional views of FIG. 13 which are taken along A—A and B—B.

If temperature varies, the resistance $R_{PL}$ of the detecting p-layer 6 of the detection portion is varied and the detection voltage value Vs varies for the same current value. The compensation principle of the temperature dependence of the detection voltage Vs will be hereunder described using a seventh embodiment as shown in FIGS. 13 and 14.

In the manufacturing process as described above, a compensating p-layer 30 (seventh semiconductor layer) having the same shape dimension (width W and length L) as the p-layer 6 is formed in the same forming step of the detecting p-layer 6, and contact holes 40 and 41 through which the contact with the compensating p-layer 30 is performed are formed at the opening time of the contact hole with the layer insulation film 9. Thereafter, the detection pad 11, the source electrode 10, the gate pad (not shown) and the temperature compensating electrode pad 31 are formed in the patterning step of the aluminum film. Through this process, the compensating p-layer 30 is contacted with the source electrode 10 through the contact hole 40, and also contacted with the compensating pad 31 through the contact hole 41. Here, the detection resistance 24 (resistance value $R_{PL}$) of the detection portion and the compensating resistance 38 (resistance value $R_{COM}$) of the temperature compensating resistance portion are simultaneously formed in the same shape, and thus the resistance values thereof are set to the same value.

Figure 14:
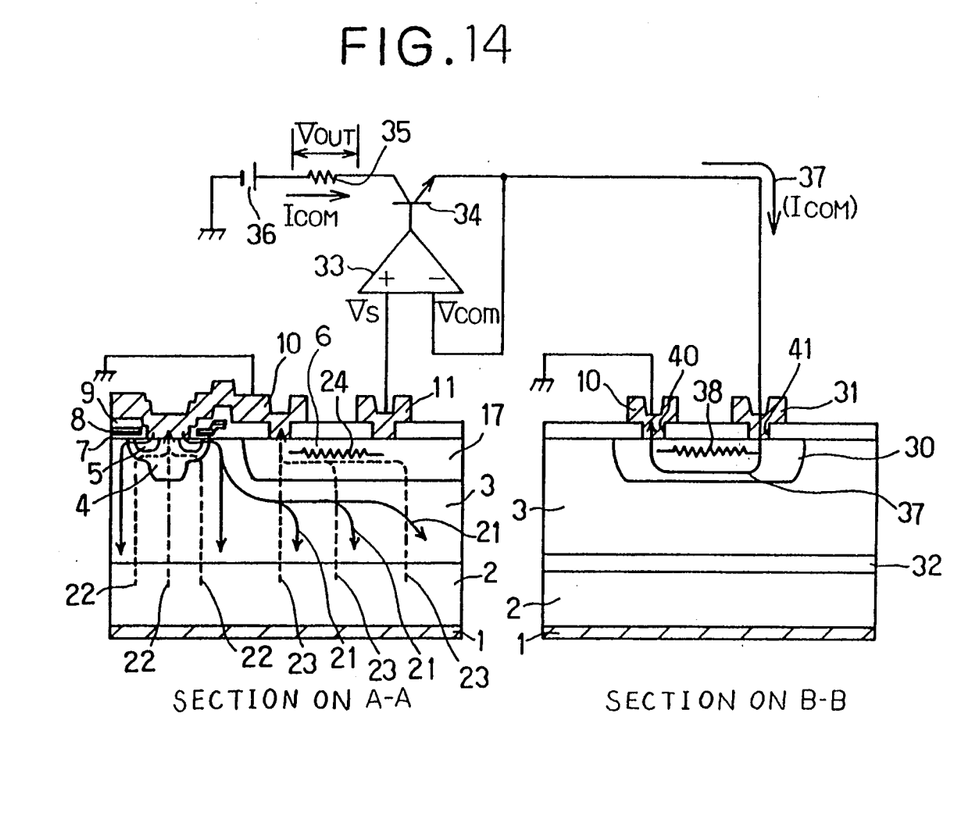
FIG. 14 is a schematic view showing the principle of a temperature compensation of the seventh embodiment.

Further, an external circuit is formed through the detection pad 11 and the compensating pad 31 as shown in FIG. 14, and the detection voltage Vs of the detection portion and the voltage signal $V_{COM}$ of the temperature compensating resistance portion are input to a differential amplifier 33. The external circuit constitutes a voltage follower circuit with the differential amplifier 33, and it serves to control a current $I_{COM}$ flowing in the compensating resistance 38 through a power source 36, an external resistance 35 and a transistor 34 so that Vs and $V_{COM}$ are equal to each other at all times.

The operation of the seventh embodiment will be hereunder described. At the actuation time of the IGBT element, the hole current $I_{HS}$ flows through the detection resistance 24 of the detecting p-layer 6 due to flow of holes 23, and the detection voltage Vs which is provided in accordance with the equation (1) occurs at the detection pad 11. The differential amplifier 33 controls the base potential of the transistor 34 so that the detection voltage Vs is equal to the potential $V_{COM}$ with respect to the source potential of the compensating pad 31 of the temperature compensating resistance portion to thereby control the current $I_{COM}$ which flows through a passageway extending from the power source 36, the external resistance 35, the transistor 34, the source electrode 10.

Here, the potential $V_{COM}$ appearing at the compensating pad 31 is represented as follows:

$$V_{COM} = R_{COM} \times I_{COM} \quad (8)$$

and the following equation is satisfied on the basis of the equations (1) and (8) because the control is carried out so that Vs is equal to $V_{COM}$ at all times.

$$I_{HS} = (R_{COM}/R_{PL}) \times I_{COM} \quad (9)$$

In this embodiment, as described above, the detecting p-layer 6 constituting the detection resistance 24 of the detection portion and the compensating p-layer 30 constituting the compensating resistance 38 of the temperature compensating resistance portion are simultaneously formed in the same shape and under the same process condition, so that the resistance values and temperature-dependence of these p-layers are the same. Therefore, the following equation is satisfied:

$$R_{PL}(T) = R_{COM}(T) \quad (10)$$

and the following equation is satisfied on the basis of the equation (9) irrespective of temperature:

$$I_{HS} = I_{COM} \quad (11)$$

That is, by monitoring the value of $I_{COM}$, the current $I_{HS}$ flowing in the detection portion can be known. Rewriting the equation (6) using the equation (11), the following equation is satisfied:

$$I_T = k \cdot I_{COM} \cdot (1 + 1/h_{FE}) \quad (12)$$

and $I_{COM}$ can be obtained by measuring the voltage drop $V_{OUT}$ at the external resistor 35 which is installed in the external circuit. Further, on the basis of the following equation, the total current $I_T$ flowing in the element can be obtained with compensation of temperature-dependence.

$$I_T = (k/R_L) \cdot (1 + 1/h_{FE}) \cdot V_{OUT} \quad (13)$$

In the equation (13), $R_L$ represents a resistance value of the external resistor 35.

In the seventh embodiment, when the current due to the holes flowing from the substrate p-layer 2 flows into the temperature compensating portion, the voltage drop due to the hole current occurs across the compensating resistance 38, and $I_{HS}$ is equal to $I_{COM}$, so that the detection accuracy is deteriorated. Therefore, in order to prevent injection of the holes from the substrate p-layer 2 at the temperature compensating resistance portion, as shown in FIGS. 13 and 14, the temperature compensating resistance portion is formed at a position which is sufficiently away from the cell area in which the electron current flows (as indicated by the arrow 21), and the high-density n+-type area 32 (eighth semiconductor layer) is formed in the neighborhood of the pn junction at the lower portion of the temperature compensating resistance portion, whereby the prevention of the hole injection is realized.

In FIG. 13, a reference numeral 6c represents a shielding p-layer which is disposed below the compensating pad 31. The shielding p-layer 6c formed in the same step as a shielding p-layer 6d below the compensating p-layer 30, the detecting p-layer 6 the detection pad 11, is formed continuously with the detecting p-layer 6 and the shielding p-layer 6d. In addition, a contact hole 17c is formed to allow the holes injected below the compensating pad 31 to flow out to the source electrode 10 through the shielding p-layer 6c. Further, a guard ring 39 is formed at the outer peripheral portion of the element.

According to the seventh embodiment, the current value flowing in the IGBT element can be monitored irrespective of the temperature variation as described above. In the seventh embodiment, the detecting p-layer 6 and the compensating p-layer 30 are designed in the same shape so that the resistance values $R_{PL}$ and $R_{COM}$ thereof are equal to each other. However, it is sufficient that the resistance temperature coefficients of the detecting p-layer 6 and the compensating p-layer 30 are equal to each other even when the resistance values thereof are not equal to each other, and the resistance temperature coefficients of these layers can be set to be equal to each other if these layers are designed under the same process condition.

The above embodiment is described for the structure of the n-channel type of IGBT, however, the same effect can be obtained in a p-channel type of IGBT.

As described above, according to the IGBT of this invention, the current detection is carried out by using the lateral resistance of the impurity-diffused area which is formed at an area different from the unit cell forming area on the surface of the element and detecting the voltage drop due to the carriers flowing in the lateral resistance. Therefore, this invention has excellent effects that no detection resistance is required to be set up at the outside to divert current for detection, and no depression of latch-up current value due to the structure of the detection portion occurs.

As described above, the IGBT can be equipped with the current detection structure with no signal detecting resistor at the outside, and without inducing depression of latch-up current value, and it is suitably usable as a power switching element having a current detection function therein. For a system having a power switching element therein, in order to prevent the switching element from being damaged due to an over-current or prevent circuit portions other than the power element from being damaged due to current supply over a permissible current value thereof value, a current value flowing in the power switching element is required to be monitored and restricted. In this case, the IGBT of this invention is very effectively usable as a power switching element.

We claim:

1. An insulated gate bipolar transistor comprising:
   a first semiconductor layer of a first conductivity type;
   a second semiconductor layer, of a second conductivity type, formed on the first semiconductor layer;
   a third semiconductor layer, of the first conductivity type, selectively formed in a surface of the second semiconductor layer;
   a fourth semiconductor layer, of the second conductivity type, selectively formed in a surface of the third semiconductor layer;
   a gate electrode formed at least on a gate insulation film on at least a channel area which corresponds to a surface of the third semiconductor layer disposed between the second semiconductor layer and the fourth semiconductor layer;
   a source electrode contacting both the third semiconductor layer and the fourth semiconductor layer;
   a drain electrode for supplying a drain current through the first semiconductor layer;
   a fifth semiconductor layer of the first conductivity type having a first contact portion contacting the source electrode, the source electrode contacting the first contact portion through a contact hole, the semiconductor region formed immediately under the contact hole consisting of only the first conductivity type portion, the fifth semiconductor layer being selectively formed in the surface of the second semiconductor layer to be independent of and spaced from the third semiconductor layer but disposed proximate to the third semiconductor layer; and
   a current signal detection electrode contacting the fifth semiconductor layer at a second contact portion of the fifth semiconductor layer, the second contact portion being disposed away from the first contact portion contacting the source electrode by a predetermined distance but having the same conductivity type as the first contact portion, the current signal detection electrode being electrically independent of the source electrode and the gate electrode, thereby detecting a voltage drop due to a current flowing across the fifth semiconductor layer between the first and second contact portions.

2. The insulated gate bipolar transistor as claimed in claim 1 further comprising a sixth semiconductor layer of the second conductivity type selectively formed in the surface of the fifth semiconductor layer to be disposed away from and between both the first contact portion and the second contact portion.

3. The insulated gate bipolar transistor as claimed in claim 1, wherein the fifth semiconductor layer is disposed proximate to a pad portion of the source electrode.

4. The insulated gate bipolar transistor as claimed in claim 1, further comprising a shielding layer of the first conductivity type formed in the surface of the second semiconductor layer at a lower portion of the pad portion of the source electrode;
   wherein the fifth semiconductor layer is formed to extend from the shielding layer.

5. The insulated gate bipolar transistor as claimed in claim 4, further comprising a sixth semiconductor layer of the second conductivity type selectively formed in the surface of the fifth semiconductor layer to be disposed away from and between both the first contact portion and the second contact portion.

6. The insulated gate bipolar transistor as claimed in claim 1, wherein the fifth semiconductor layer is disposed proximate a pad portion of the gate electrode.

7. The insulated gate bipolar transistor as claimed in claim 1, further comprising a shielding layer of the first conductivity type formed in the surface of the second semiconductor layer at a lower portion of the pad portion of the gate electrode;
   wherein the fifth semiconductor layer is formed to extend from the shielding layer.

8. The insulated gate bipolar transistor as claimed in claim 7, further comprising a sixth semiconductor layer of the second conductivity type selectively formed in the surface of the fifth semiconductor layer to be disposed away from and between both the first contact portion and the second contact portion.

9. The insulated gate bipolar transistor as claimed in claim 1, wherein the fifth semiconductor layer is disposed proximate to a pad portion of the current signal detection electrode.

10. The insulated bipolar transistor as claimed in claim 9, further comprising a shielding layer of the first conductivity type formed in the surface of the second semiconductor layer at a lower portion of the pad portion of the current signal detection electrode;

wherein the fifth semiconductor layer is formed to extend from the shielding layer.

11. The insulated gate bipolar transistor as claimed in claim 10, further comprising a sixth semiconductor layer of the second conductivity type selectively formed in the surface of the fifth semiconductor layer to be disposed away from and between both the first contact portion and the second contact portion.

12. The insulated gate bipolar transistor as claimed in claim 1, further comprising:

a seventh semiconductor layer of the first conductivity type formed at a position away from the third semiconductor layer in the second semiconductor layer to be independent of the third semiconductor layer and have a same resistance temperature coefficient the fifth semiconductor layer, said seventh semiconductor layer having a contact portion contacting the source electrode; and a temperature compensating signal detection electrode contacting the seventh semiconductor layer at a position away from the contact portion of the seventh semiconductor layer with the source electrode by a predetermined distance and which is formed independently of the source electrode, the gate electrode and the current signal detection electrode.

13. The insulated gate bipolar transistor as claimed in claim 12, further comprising an eighth semiconductor layer of the second conductivity type disposed at the junction between the first semiconductor layer and the second semiconductor layer below the seventh semiconductor layer, the impurity concentration of the eighth semiconductor layer being higher than that of the second semiconductor layer.

14. The insulated gate bipolar transistor as claimed in claim 12, wherein said seventh semiconductor layer has a same electrical resistance as said fifth semiconductor layer.

* * * * *